United States Patent [19]

Kelly et al.

[11] Patent Number: 5,440,124
[45] Date of Patent: Aug. 8, 1995

[54] HIGH MASS RESOLUTION LOCAL-ELECTRODE ATOM PROBE

[75] Inventors: Thomas F. Kelly, Madison; Patrick P. Camus; David J. Larson, both of Middleton; Louis M. Holzman; Sateeshchandra S. Bajikar, both of Madison, all of Wis.

[73] Assignee: Wisconsin Alumni Research Foundation, Madison, Wis.

[21] Appl. No.: 272,204

[22] Filed: Jul. 8, 1994

[51] Int. Cl.⁶ .......................................... H01J 37/285
[52] U.S. Cl. .................... 250/309; 250/287; 250/423 F
[58] Field of Search ................. 250/309, 287, 423 F

[56] References Cited

U.S. PATENT DOCUMENTS

| | | | |
|---|---|---|---|
| 3,602,710 | 7/1971 | Mueller | 250/309 |
| 3,819,941 | 6/1974 | Carrico | 250/281 |
| 3,868,507 | 2/1975 | Panitz | 250/287 |
| 5,061,850 | 10/1991 | Kelly et al. | 250/306 |
| 5,347,132 | 9/1994 | Holzman et al. | 250/389 |

FOREIGN PATENT DOCUMENTS 8700682 1/1987 WIPO .

OTHER PUBLICATIONS

M. K. Miller and G. D. W. Smith, *Atom Probe Microanalysis: Principles and Applications to Materials Problems* (book), Materials Research Society, Pittsburgh, Pa., 1989, Chap. 5, pp. 127–156.
U. Rolander, et al., "Design of an Atom Probe High Voltage Pulsar," Surface Science, vol. 246, 1991, pp. 390–395.
C. A. Spindt, "Microfabricated field–Emission and Field Ionization Sources," Surface Science, vol. 266, 1992, pp. 145–154.
T. F. Kelly, et al., "Atom Probe Microscopy And Its Future," Materials Research Society, Boston, Massachusetts, Dec. 1993.
Thomas F. Kelly, et al., "Three-Dimensional Atom Probe Studies of Solid–State Interfaces," Bulletin of the Microscopy Society of America, Jan. 1994.
V. S. Belkin, et al., "Forming of High–Voltage Nanosecond and Subnanosecond Pulses Using Standard Power Rectifying Diodes," Rev. Sci. Instrum., vol. 65, No. 3, Mar. 1994, pp. 751–753.
Osamu Nishikawa, et al., "Toward a Scanning Atom Probe—Computer Simulation of Electric Field—." Applied Surface Science, vol. 76/77, Mar. 1994, pp. 424–430.
R. A. King, et al., "Atom Probe Analysis and Field Emission Studies of Silicon," J. Vac. Sci. Technol. B. vol. 12, No. 2, Mar./Apr. 1994, pp. 705–709.
M. Huang, et al., "Characterization of Gridded Field Emitters," J. Vac. Sci. Technol. B, vol. 12, No. 2, Mar.-/Apr. 1994, pp. 713–716.

*Primary Examiner*—Jack I. Berman
*Attorney, Agent, or Firm*—Foley & Lardner

[57] ABSTRACT

An atom probe provides rapidly pulsed field evaporation/desorption of ions from a tip utilizing a local extraction electrode positioned closely adjacent to the tip. A bias potential is applied between the tip and the local extraction electrode which provides an electric field at the tip which is less than but near the field intensity required for field evaporation of ions. Additional potential is applied between the tip and the extraction electrode in relatively low over-voltage pulses to obtain field evaporation of ions without substantially accelerating the ions. The ions extracted from the tip by the sharply defined pulses pass through an aperture in the extraction electrode and are accelerated by a large potential difference between the tip and a detector spaced from the tip and the local extraction electrode. An intermediate acceleration electrode may be positioned between the extraction electrode and the detector, with the acceleration electrode having an aperture therein to pass ions therethrough to the detector. The acceleration electrode is maintained at a higher potential with respect to the tip than the extraction electrode, and may be maintained at the same potential as the detector so that ions passed through the acceleration electrode coast to the detector. The use of relatively low voltage pulses to obtain evaporation of ions permits rapid repetition of the pulses, on the order of hundreds of thousands of pulses per second, to allow rapid accumulation of atom probe data.

31 Claims, 9 Drawing Sheets

Alignment holes   Alignment Holes

Mesa Etching

Electroplating Electrode

Etching Through Hole

HIGH MASS RESOLUTION LOCAL-ELECTRODE ATOM PROBE

This invention was made with United States Government support awarded by NSF, Grant #DMR 89-11332. The United States Government has certain rights in this invention.

FIELD OF THE INVENTION

This invention pertains generally to the field of microscopy and particularly to atom probes and mass spectrometry.

BACKGROUND OF THE INVENTION

The field ion microscope (FIM) was introduced by Müller in 1951. The specimen in this instrument is the anode and an imaging gas (hydrogen, or an inert gas) is introduced into the system at low pressure ($10^{-3}$ Pa). Ionized gas species produce the image at the screen. In 1967, Müller, et al. introduced the atom probe field ion microscope (APFIM). In this instrument, the imaging gas is removed and, with the tip operating as an anode, the field is increased to the point where the atoms on the surface are evaporated by the field. A very high electric field (about $10^{10}$ V/m) is created at the surface of the tip by applying a high voltage between the tip and an image screen. The tip is sharply pointed with a radius of curvature at the apex of about 10 to 200 nm. Since the process of field evaporation involves ionizing the atoms, they are accelerated to the imaging screen by the applied field. In the APFIM, the flight times of ions from the specimen to the image screen are used to identify the ions. The field evaporation must be pulsed so that a definite time of departure can be determined. The standing high voltage is kept low enough so that the evaporation rate between pulses is negligible. A very short duration (less than 10 ns), high voltage (20% greater than the standing voltage) pulse is applied which causes evaporation of a fraction of a monolayer of atoms from the specimen surface on each pulse. This approach is known as voltage pulsing or field pulsing.

In the conventional APFIM, an aperture with a virtual size of 0.2–10 nm is placed in the image screen to allow the ions from a specific location on the tip to pass through into a time-of-flight mass spectrometer. Because the identification of elements is based on time-of-flight, all isotopes are detected, and there are no mass limitations either at high or low masses. However, the virtual image is typically only a few atom diameters wide at the detector plane, and no positional information about the ions is recorded. Thus, data from this conventional instrument is inherently one dimensional. The lateral resolution varies from about 0.2 nm to 10 nm depending on the magnification, but the depth resolution is typically the atomic plane spacing in the axial direction of the specimen. Unfortunately, the data collection method makes inefficient use of the sample since most of the specimen atoms that are evaporated are never analyzed.

The imaging atom probe and the wide angle atom probe are early types of three-dimensional atom probes (3DAP) which were developed in response to such inefficiencies. The 3DAP can, in principle, determine the identity and original location of every atom which hits the image screen. It has the ability to measure both the time-of-flight of a given ion to the wide angle image plane and the arrival position on that plane. In this way, both the position and identity of the atoms on the surface of the tip are determined. An initial instrument of this type is discussed in the paper by A. Cerezo, et al., *Rev. Sci. Instrum.*, Vol. 59, 1988, pp. 862, et seq. Cerezo, et al. refer to the instrument as a position-sensitive atom probe (POSAP). Incoming ions strike a microchannel plate and the electron charge cloud that is produced is accelerated onto a position-sensitive anode. The three-dimensional position of an atom is determined from the two-dimensional arrival position on the image screen and by tracking of the arrival sequence of atoms in time as each layer is evaporated. Since the information is electronically recorded, images may be viewed and quantitatively analyzed in a wide variety of formats. A further development of a high-repetition-rate position-sensitive atom probe is shown in U.S. Pat. No. 5,061,850 to Kelly, et al.

Conventional voltage pulsing in 3DAP creates a problem with mass resolution. The applied voltage pulses must have a sub-nanosecond rise time and only a few nanoseconds duration. The ions typically leave the tip on the leading edge of the pulse, close to the maximum voltage. However, they may leave over a range of voltages and thus acquire a range of total energies. The uncertainty in the evaporation voltage of the ions for such a pulse is typically 1–5%. Since potential energy is converted to kinetic energy during flight, this range of voltages leads to a range of flight times for a given mass-to-charge ratio. Thus, the timing resolution or mass resolution suffers in voltage-pulsed atom probes. In short flight path instruments such as a 3DAP this resolution can be as poor as one part in fifty. One part in two hundred is commonly considered to be adequate mass resolution for a large fraction of materials analyses. Better resolution is always beneficial for separating closely spaced isotopic peaks.

Conventional atom probes may be provided with devices which compensate for the kinetic energy spread of the ions in voltage pulsing. The resulting mass resolution can be as high as one part in two thousand. However, there has been no previously demonstrated approach that achieves high mass resolution in a 3DAP without unduly sacrificing image size. The best reported mass resolution in a 3DAP is one part in three hundred utilizing an instrument which has a one meter long flight path but a field of view of only 10 nm laterally. A. Bostel, et al., *J. de Physique*, Vol. 50–C8 1988, pp. 501 et seq.

The conventional device used to produce voltage pulses with the required performance for conventional atom probes is a mercury-wetted reed switch. Reed switches are mechanical devices, however, and cannot be operated at frequencies much higher than about 200 pulses per second. Since ion flight times do not normally exceed 10 microseconds (1 microsecond in 3DAPs) atom probes could be operated at much higher speeds if higher repetition rate pulsers were available.

It is also possible to momentarily increase the field evaporation rate by pulsing the temperature of the tip, which is known as "thermal pulsing". The use of a pulsed laser for inducing field evaporation is reported in the articles by T. T. Tsong, *Surf. Sci.*, Vol. 70, 1978, pp. 219 et seq., and G. L. Kellogg, et al., *J. Appl. Phys.*, Vol. 51, 1980, pp. 1184 et seq. The major advantage of this approach over voltage pulsing is that the applied field is constant during the pulse, which effectively eliminates this contribution to uncertainty in mass resolution. The use of an electron-beam pulse to stimulate evaporation of ions is also discussed in the aforesaid patent by Kelly, et al., U.S. Pat. No. 5,061,850. In such devices, the electron-beam pulse may heat a small enough volume of a tip (less than 200 nm length) so that the thermal pulse will be very short (sub-nanosecond) and may be repeated at high rates (greater than 106 pulses per second).

Another limitation of atom probes is the preparation of samples into the required geometrical form. Fabrication of a specimen from a metal wire or bulk sample, although tedious, is relatively easy and similar to sample preparation for transmission electron microscopy. However, making a sample with the desired orientation from a multilayer sample or from a semiconductor wafer can be quite complicated and often may be impossible. A flat-plate geometry that can be more easily utilized in chemical analysis instrumentation has recently been proposed for use in a "scanning atom probe". See 0. Nishikawa, et al., *Applied Surface Science*, Vol. 76/77, 1994, pp. 424–430. This article suggests mechanically microgrooving a flat-plate to produce a specimen with many microtips normal to the plate. This type of specimen would allow selection of analysis areas on various structures not easily investigated with conventional atom probes. It would also make it possible to produce large numbers of separate tips in a single preparation procedure. Preparation of specimens using the technique of "ion beam mask etching" has been done initially by J. A. Liddle, et al., *J. de Physique*, 49–C6 (1988) 509 et seq. This process produces a random or mosaic array of microtips by deposition of small particles on a substrate with subsequent ion sputtering to form cones of unetched material under the particles deposited on the substrate. Many variations on this approach are possible. Particles of various types including polymer spheres, metallic spheres and ceramic particles can be used as masks.

As discussed above, the scanning atom probe was proposed to reduce atom probe specimen preparation difficulties. However, if the voltage is applied solely between the sample and the detector, evaporation from many tips will occur, leading to superimposition of the data. To overcome this limitation, Nishikawa, et al., supra, proposed that a local-extraction electrode be used to confine the high field to a particular tip. The calculations performed by Nishikawa, et al. demonstrate the feasibility of this concept for a high potential applied between the local electrode and the tip which serves to evaporate the ions and accelerate them.

The concept of a local-extraction electrode is also the basis for the operation of field emitter arrays which achieve field electron emission at very low voltages. Field electron emission currents of 50 to 150 $\mu$A can be achieved from single tips of a radius of about 50 nm using 100 to 300 volts. C. A. Spindt, et al., *J. Appl. Phys.*, Vol. 47, 1976, pp. 5248, et seq. This voltage is approximately a factor of 10 less than what is normally required for a conventional field electron emitter with the anode essentially at infinity. Spindt, et al. also concluded that when the tip radius is in the 50 to 150 nm range, rather than an inverse relation between tip radius and field, the radius appears to have only a second order effect on the field. Experiments have also shown field ionization using an extraction-electrode geometry at voltages on the order of 1,000 volts. C. A. Spindt, *Surf. Sci.*, Vol. 266, 1991, pp. 145 et seq. This value is again about a factor of 10 less than what is normally required for field ionization.

SUMMARY OF THE INVENTION

The present invention is generally applicable to time-of-flight mass spectrometers, of which an atom probe is one embodiment. The present invention is capable of rapidly pulsed field evaporation or desorption of ions from a tip utilizing a local-extraction electrode positioned closely adjacent to the tip. The bias potential between the tip and the local-extraction electrode is relatively low, for example, on the order of 1,000 volts, with evaporation taking place by applying relatively low over-voltage pulses between the tip and the local-extraction electrode, e.g., on the order of 20% or 200 volts, to obtain field evaporation of ions without substantially accelerating the ions. The extraction electrode is preferably formed as a hollow conical structure with an aperture at the center of the top. The evaporated ions pass through the aperture in the local-extraction electrode and are accelerated by a high main acceleration voltage between the extraction electrode and the detector, or between the extraction electrode and an intermediate acceleration electrode. The acceleration electrode may be formed as a plate with an aperture therein configured to allow ions to readily pass therethrough toward the detector.

Because field evaporation using the local-extraction electrode requires only a relatively low voltage pulse to cause evaporation, the generation of pulses with the required shape is easier to perform. Also, the pulse may have better performance features, e.g., 100-picosecond risetime and nanosecond duration. This will result in all of the evaporated ions being extracted from the tip at essentially the same time. Thus, there will be very little time spread between the ions evaporated from the tip. These ions are then accelerated toward the detector by the larger potential difference between the extraction electrode and the detector. As in a conventional atom probe, there will be a spread in ion energies due to evaporation at different voltages during the voltage pulse. However, because the pulse magnitude is a smaller fraction of the total voltage between the tip and the detector for this configuration than for conventional atom probe, substantially all of the evaporated ions will be accelerated to the same final energy level. Fundamentally, the voltage applied between the extraction electrode and the tip will cause the evaporation of ions from the tip and the voltage between the extraction electrode and the detector will determine the time-of-flight. As a consequence of these factors, the time-of-flight, i.e., the time between the initiation of the evaporation pulse and the arrival of individual ions at the detector, can be used to very accurately measure the mass of the ions reaching the detector, allowing highly accurate mass-to-charge spectra to be obtained for the emitted ions. Moveover, such mass spectra can be obtained as a function of position on a position-sensitive detector.

High mass resolution is obtainable even if the instrument is not operating with a low (e.g., 1,000 V) voltage on a local-extraction electrode by utilizing an intermediate acceleration electrode and increasing the magnitude of the main acceleration voltage° In this manner, existing atom probes may be modified for higher mass resolution operation.

A further advantage of the present invention is that because local-electrode field evaporation of ions requires only relatively low voltages, very fast electronics can be utilized to provide the evaporation pulses as compared to conventional atom probe systems which require slow high voltage switching components (mechanical reed switches). Consequently, the pulse repetition rate for the evaporation of ions in the present invention may be in the range of several hundred thousand to a million pulses per second as opposed to a few hundred pulses per second as in conventional systems. Consequently, the present invention allows much faster acquisition of mass spectroscopy data.

Although the present invention may be utilized with conventional single tip electrodes, a preferred tip structure includes a plurality of tips, which may comprise several hundred tips formed on a planar substrate. The tips may be formed in various manners, such as by microgrooving a flat substrate into a matrix of tips, or by ion beam mass etching. Subsequent processing of the various microtips can be carried out so that different microtips on the same substrate have different materials of interest present therein. A particular one of the microtips can be selected for evaporation by positioning the local-extraction electrode adjacent and in close proximity to a selected microtip, with the aperture of the extraction electrode just above the microtip. In this manner, the potential applied to the extraction electrode will evaporate ions only from the selected microtip and not from adjoining microtips on the substrate. Positioning of the microtip with respect to the extraction electrode can be carried out in various ways, including the use of an optical microscope to align a selected microtip with the aperture in the extraction electrode.

In addition, the tip may be positioned relative to the extraction electrode through use of field electron emission current from the tip to the electrode. Field electron emission is most commonly used in scanning tunneling probe microscopy. To accomplish this, a moderate negative voltage of several hundred volts may be applied between the tip and the extraction electrode, causing field emission of electrons from the tip to the electrode. As the tip is moved closer to the electrode, the field electron emission current will increase. Once the tips and electrode are in close proximity, the tip may be scanned to map the electrode and determine the location of the aperture in the electrode. The tip may then be moved to the location at the center of the electrode, the voltage reversed for atom probe operation, and evaporation of ions from the tip obtained as described above.

The atom probe of the present invention utilizes an extraction-electrode equipped atom probe to form a local-electrode atom probe (LEAP). The atom probe of the present invention may also utilize a position-sensitive detector which is capable of measuring not only the position of the impact of the ion, but also the time of arrival of the ion. In this manner, both the position of the ion as extracted from the tip and the mass spectral properties of the ion, as determined by the time-of-flight measurements, are available.

Further objects, features and advantages of the invention will be apparent from the following detailed description when taken in conjunction with the accompanying drawings.

BRIEF DESCRIPTION OF THE DRAWINGS

In the drawings:

FIG. 14 $V_E=1000$ volts, $\Delta t=1$ ns; FIG. 15 $V_E=100$ volts, $\Delta t=156$ ps; FIG. 16 $V_E=300$ volts, $\Delta t=1$ ns; FIG. 17 $V_E=300$ volts, $\Delta t=156$ ps.

DETAILED DESCRIPTION OF THE INVENTION

Figure 1:
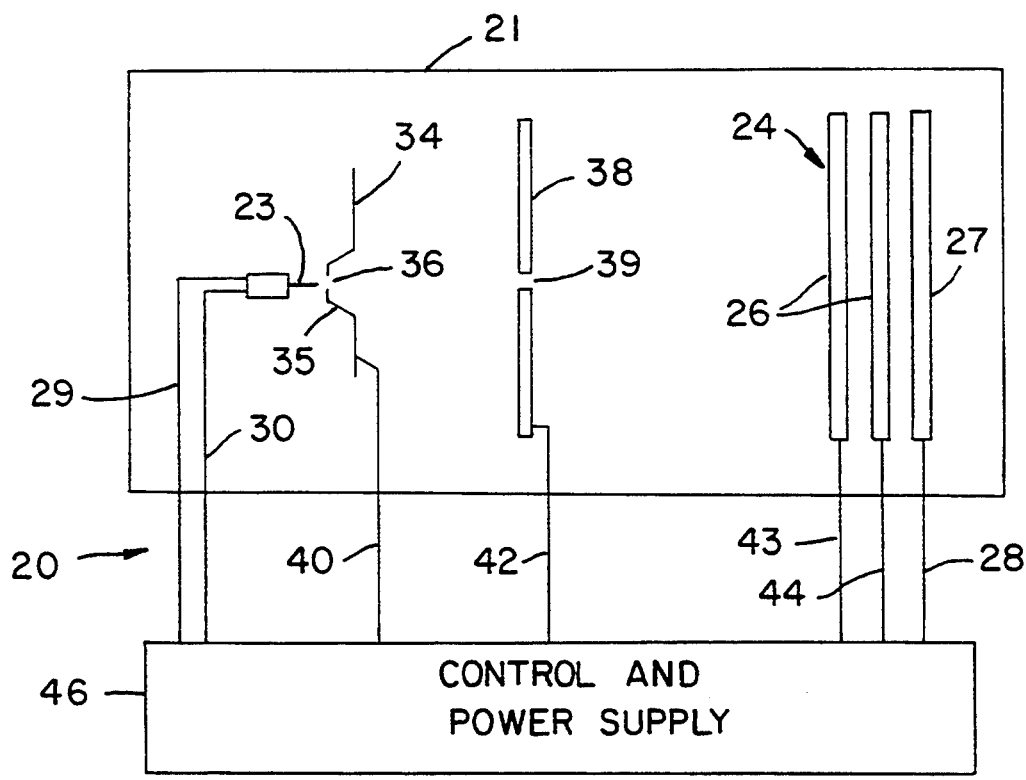
FIG. 1 is a schematic view of an atom probe in accordance with the present invention.

With reference to the drawings, a schematic view of an atom probe in accordance with the present invention is shown generally at 20 in FIG. 1. The atom probe has a main vacuum chamber 21 which encloses a portion of the atom probe, a sample tip 23 which is positioned at one end of the chamber, and a detector 24 positioned at the other end of the chamber. The sample tip may be cooled in a conventional manner, if desired, such as by a liquid nitrogen cryostat or a mechanical refrigeration cryocooler. The detector 24 has a microchannel plate 26 which may be formed as a double plate as shown. The detector plate 27 that is mounted behind the microchannel plates may be a single-element anode or a position-sensitive anode. A line 29 extends to the tip 23 to allow the application of a high voltage to the tip, and another line 30 is connected to a temperature monitor at the tip to monitor its temperature. The foregoing components may be of standard construction utilized in various atom probes. An example of a position sensitive atom probe structure in which the present invention may be incorporated is set forth in U.S. Pat. No. 5,061,850 to Kelly, et al., entitled "High-Repetition Rate Position Sensitive Atom Probe" the disclosure of which is incorporated herein by reference. The microchannel plate 26 and the detector plate 27 may be as set forth in the aforesaid patent to Kelly, et al. A preferred position-sensitive detector is described in U.S. patent application Ser. No. 08/099,938, filed Jul. 30, 1993, now U.S. Pat. No. 5,347,132, entitled "Position Sensitive Detector Providing Position Information With Enhanced Reliability and Performance" the disclosure of which is incorporated herein by reference.

The atom probe of the present invention includes a local-extraction electrode 34 which has a preferably raised portion 35 which extends closely adjacent to the point of the tip 23. An aperture 36 is formed in the raised portion 35 of the local electrode 34. This aperture is positioned directly over the tip in a cylindrically symmetric fashion so that ions emitted from the tip 23 will largely pass through the aperture 36 to be accelerated toward the detector 24. The atom probe 20 further includes an intermediate acceleration electrode 38 which has an aperture 39 through which ions may pass toward the detector 24. The intermediate acceleration electrode 38 may generally be formed of a plate of conductive metal, e.g., stainless steel or copper, with a hole drilled in it to form the aperture 39. In the present invention, a potential is applied by a conducting line 40 connected to the local-extraction electrode 34, by a conducting line 42 connected to the intermediate acceleration electrode 38, by conducting lines 43 and 44 connected to the microchannel plates 26 and by a conducting line 28 to the detector plate 27. The total voltage between the tip 23 and the microchannel plates 26 of the detector 24 is typically on the order of 10 kilovolts (kV). In the present invention, the voltage on the line 43 connected to the input-side of the detector 24 is typically held at ground potential. A lower extraction voltage is applied between the lines 29 and 40, and thereby between the tip 23 and the local-extraction electrode 34, typically on the order of 1,000 volts. A bias voltage is applied to the line 42 relative to the line 29, and thereby between the intermediate acceleration electrode 38 and the tip 23, typically of from 2 to 10 kV. If desired, all of the acceleration potential may be applied between the acceleration electrode 38 and the tip 23, with no potential difference between the acceleration electrode 38 and the detector 24 so that the ions passing through the aperture 39 of the acceleration electrode 38 into a field-free region coast without acceleration to the detector 24. This configuration is the preferred configuration that will be used for further discussion. The voltage supply lines 29, 40, 42-44, and the signal lines 28 and 30 are connected to a control and power supply system 46 which is described further below.

In accordance with the present invention, field evaporation is achieved by applying sharply defined pulses of additional voltage between the lines 29 and 40, and thereby between the tip 23 and the extraction electrode 34, to evaporate ions from the tip 23. The overvoltage pulses are an additional voltage above the bias voltage applied between the extraction electrode 34 and the tip 23. Because of the very close proximity between the top of the raised portion 35 of the extraction electrode 34 and the tip 23 (e.g., about 1 μm), the local electric field at the apex of the tip is very high, and close to the electric field intensity required for field evaporation of ions while the bias voltage is applied between the tip 23 and the extraction electrode 34. Only a relatively small amount of additional voltage in each pulse is required on top of the bias voltage to cause field evaporation to occur. For example, the voltage pulse applied on top of the, e.g., 1,000 volt, bias voltage may be on the order of 200 volts. Electronic instruments are available which are capable of providing pulses in this voltage range having the correct shape, e.g., sub-nanosecond rise-time and one to five nanoseconds duration (e.g., Avtech Electrosystems, Ltd., Model AVR-E4-C). The advantage of these electronic instruments over the conventional mechanical devices required for higher voltage pulses is the increased repetition rates, e.g., 100,000 Hz vs. 100 Hz. In addition, because the total voltage pulse required for evaporation in the present invention is only a few hundred volts, e.g., 200 volts, whereas in conventional atom probe mass spectrometry the voltage pulses required must be larger, e.g., 2,000 volts, the uncertainty in the energy of evaporation of the ions in the present invention will be relatively small as compared to conventional atom probe. Because the function of accelerating the ions to their final voltage is performed by the acceleration electrode 38, only relatively low bias voltage and pulse voltage levels need be applied to the extraction electrode 34 with respect to the tip 23.

Figure 2:
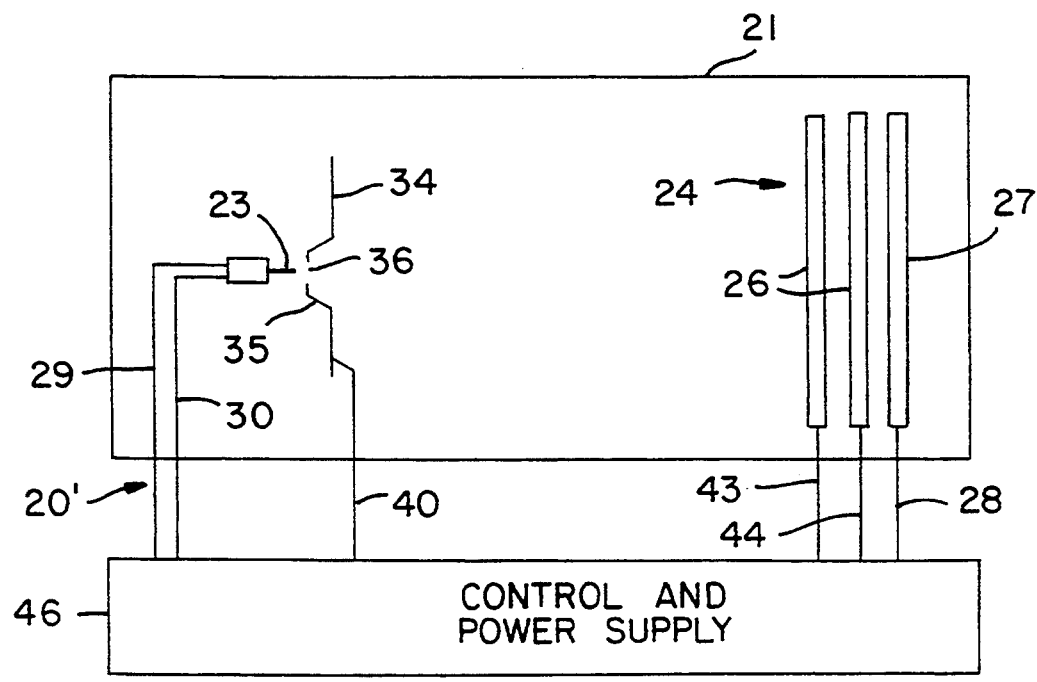
FIG. 2 is a schematic view of an atom probe as in FIG. 1 but which does not utilize an intermediate acceleration electrode.

A modification of the system of FIG. 1 is shown in FIG. 2 in which the atom probe apparatus 20' is the same as in FIG. 1, but without the acceleration electrode 38. In such a case, the full acceleration voltage, e.g., 10,000 volts, may be applied between the line 29 connected to the tip 23 and lines 43 connected to the detector 24. In such a case, evaporation occurs due to the extraction voltage between the tip 23 and the extraction electrode 34 while further acceleration occurs between the extraction electrode 34 and the detector 24.

Figure 3:
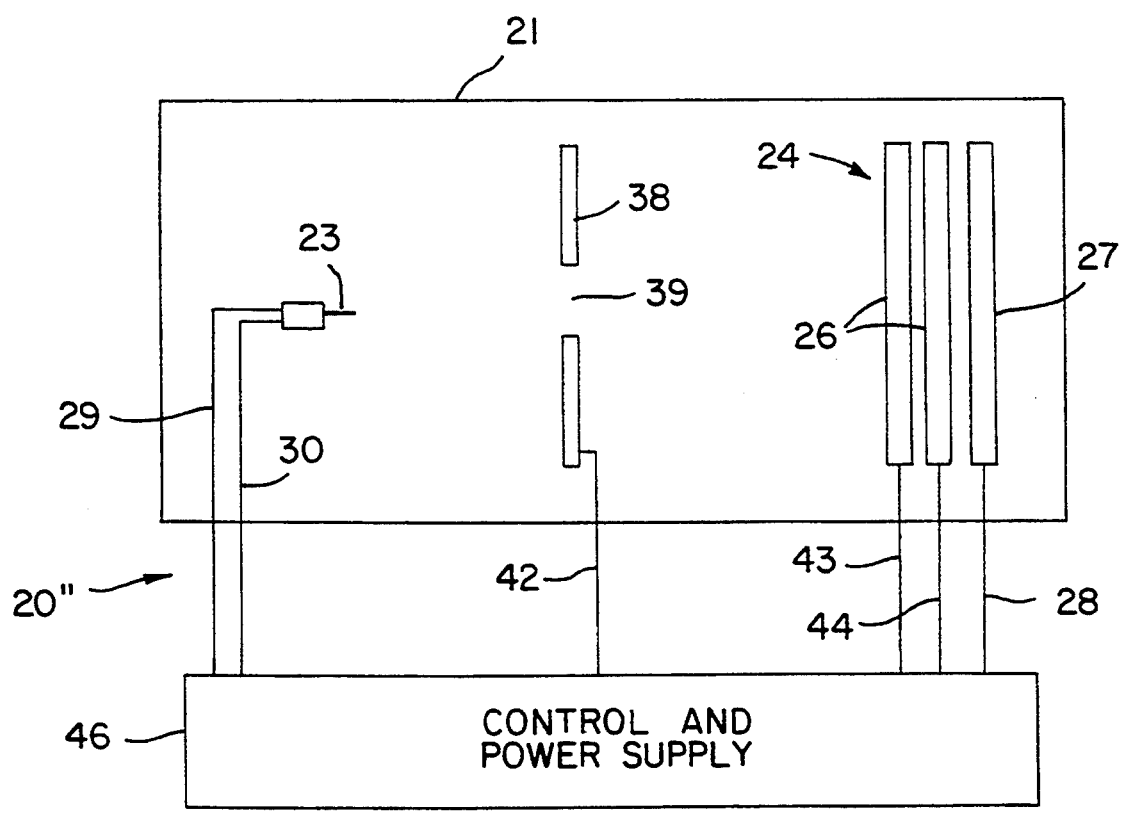
FIG. 3 is a schematic view of an atom probe as in FIG. 1 but which does not utilize a local-extraction electrode.

FIG. 3 illustrates a modification of the system shown in FIG. 1 wherein the atom probe apparatus 20'' is the same as that in FIG. 1, but without the local-extraction electrode. In such a case, the evaporation occurs at conventional atom probe voltages, e.g., 10,000 volts, between the tip 23 and the intermediate acceleration electrode 38. A high voltage (e.g., 10 KV to 100 KV) is applied between the acceleration electrode 38 and the detector 24 so that further acceleration of ions occurs between the acceleration electrode and the detector 24. This has the effect of reducing the energy uncertainty in the mass resolution of the ions by decreasing the ratio of extraction voltage relative to the total voltage as described further below.

Figure 4:
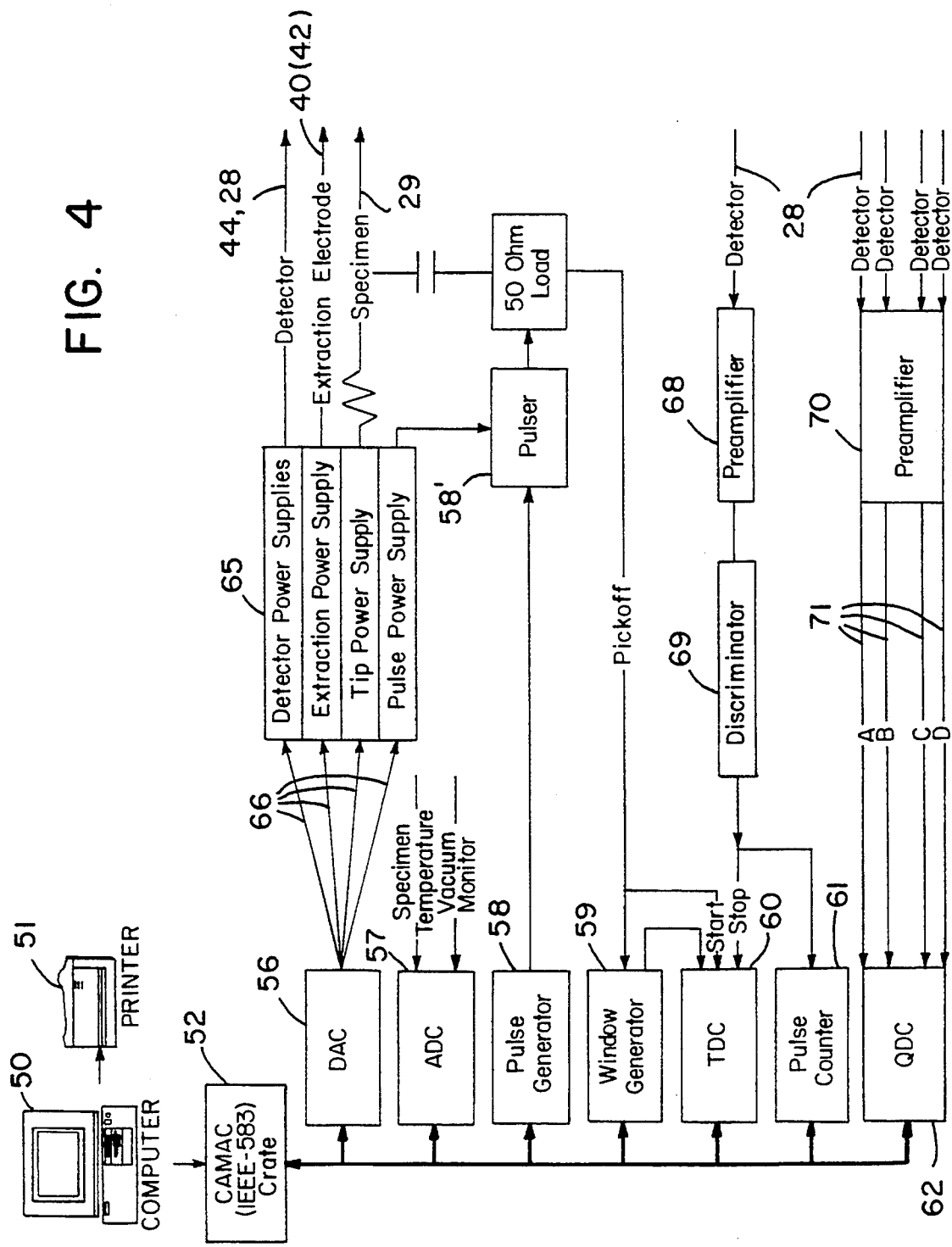
FIG. 4 is a schematic block diagram of the control and power supply system for the atom probe of the present invention.

A schematic block diagram of a controller and power supply system 46 for the atom probe of FIGS. 1 or 2 is shown in FIG. 4. The controller and power supply system 46 of FIG. 4 can be used for the atom probe of FIG. 3 by removing line 40 from the power supplies 68 and connecting line 42 in its place. The controller and power supply of FIG. 4 includes a computer 50 having input and output devices 51 (e.g., a printer, etc.) and is connected to a standard CAMAC system 52, or similar expansion bus, which includes a crate controller (e.g., Kinetics Systems 1525). A CAMAC dataway 54 provides communication to various devices, including digital-to-analog converters 56 (e.g., Joerger DAC 616), analog-to-digital converters 57 (e.g., Joerger ADC 616) which receives the specimen temperature signal and a vacuum monitor signal, pulse generator 58 and pulser 58', window generators 59 (e.g., LeCroy 2323A), 60 time-to-digital converters (e.g., LeCroy 4208), pulse counters 61 (e.g., Kinetics Systems 3610) and charge-to-digital converters 62 (e.g., Phillips Scientific 7166). Such devices are of standard construction and their function and purpose are described further in the above-referenced patent to Kelly, et al., U.S. Pat. No. 5,061,850 and the above-referenced patent U.S. Pat. No. 5,347,132. The pulse generator 58 may be of various conventional designs, for example, using a conventional reed switch as the pulser 58' or as described in the articles by U. Rolander, et al , "Design of An Atom-Probe High Voltage Pulser," *Surface Science* Vol 246, 1991, pp 390 et seq., and/or V. S. Belkin, et al., "Forming of High-Voltage Nanosecond and Subnanosecond Pulses Using Standard Power Rectifying Diodes," *Rev. Sci Instrum.*, Vol 65, No. 3, March 1994, pp 751 et seq., incorporated herein by reference.

The system of FIG. 4 further includes power supplies 65 which communicates by lines 66 to the DAC's 56. The power supply includes a power supply for the detector (e.g., Bertan Assoc. Inc. PMT-20 or PMT-50), the acceleration electrode (Bertan Assoc. Inc. 205B-30P), the tip (Bertan Assoc. Inc. 205B-30P), and for the pulsed power to the tip (Bertan Assoc. Inc. 205B-05R). Signals received back from the detector on the lines 28 (which generally are plural lines relating to the arrival times and to the various locations on the detector on which charge is received) are brought back to a preamplifier 68 (e.g., from Phillips Scientific) and then through a discriminator 69 (e.g., from Phillips Scientific) to the time-to-digital converter 60 and a pulse counter 61. Further description of the time of arrival determination and the pulse counting is set forth in the aforesaid U.S. Pat. No. 5,061,850 and U.S. Pat. No. 5,347,132. The signals from the detector are also passed to a preamplifier 70 which provides output signals on lines 71 to the charge-to-digital converter 62, the operation of which is also described in the aforesaid patent and patent application which are incorporated herein by reference. In the present invention, the pulsing of the electrode preferably takes place rapidly, e.g., at several thousand to a million pulses per second, to obtain rapid accumulation of data from the atom probe. These data may include both position of impact and also the mass-to-charge of the ions at the location of impact. In this manner three dimensional atom probe (3DAP) information can be accumulated in the computer 50 for display on the computer screen, for off-screen storage and manipulation, for printing out on the printer 51, etc., in a well known manner.

Figure 6:
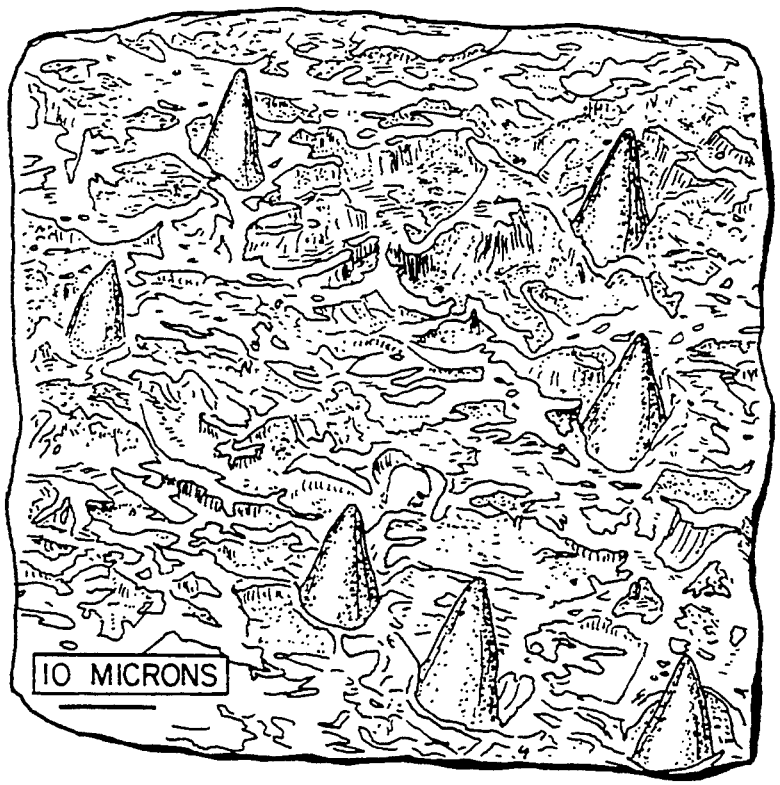
FIG. 6 is a scanning electron micrograph of many copper tips created by ion milling of the structure as in FIG. 5.
Figure 5:
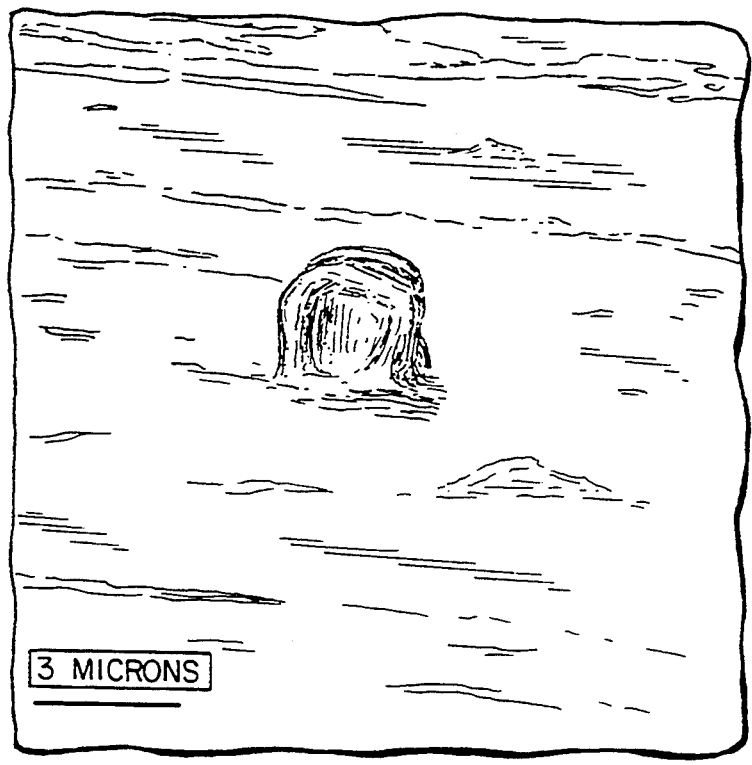
FIG. 5 is a scanning electron micrograph of a single diamond particle deposited on a copper substrate in preparation for ion milling.

Although a single tip 23 is shown in FIGS. 1 and 2, it is understood that any of various multiple tip constructions may also be utilized. An exemplary and preferred structure is a flat-plate substrate which includes multiple tips thereon which can be selected for extraction by the local electrode 34 by proper positioning of the electrode with regard to the selected tip. A preferred manner of producing multiple tips utilizes the technique sometimes referred to as "ion beam mask etching", a microfabrication process which produces a random or mosaic array of identical microtips. In this process a flat surface is first masked by placing particles thereon, as illustrated in the photomicrograph in FIG. 5, and then the surface is eroded by ion sputtering or reactive ion etching to provide conical structures as shown in FIG. 6. In FIG. 5, the particles are diamond on a copper substrate, and the tips shown in FIG. 6 consist of copper with the material surrounding the tips removed. Particles of many types can be utilized as masking particles including polymer, metallic and ceramic particles. Diamond and alumina are well-suited for this application due to their very low sputtering rate. It is also possible to use electron-beam fabricated carbon contamination spikes as a mask, allowing straight-forward selection of features of interest interactively in a scanning electron microscope. It is also possible to deposit masks lithographically both with and without regard to the position of the masks on the underlying microstructure. In this manner, tips may be fabricated, for example, from a particular metalization region in a device or in a linear array across a grain boundary.

Diamond particles normally used for polishing were chosen due to their low sputtering rate and ease of availability. The particles were deposited from a METADI® diamond suspension diluted 1:7. The particles have a somewhat random shape and orientation on the substrate. The size of the particle and the relative mill rates of the particle and substrate will determine the final length of the tip.

An optimum sputtering time was determined using 3 $\mu$m particles on a copper substrate. After 180 minutes a diamond particle remained clearly visible on top of the forming copper spike. This result was confirmed by energy dispersive X-ray spectroscopy analysis. After 360 minutes, the diamond was completely removed and a sharp copper tip remained. The radius of curvature and the length of this tip are estimated to be less than 50 nm and approximately 15 $\mu$m, respectively. The shank angle is approximately 36°. This compares to a theoretical calculated value of 34.9°.

A 6 $\mu$m particle was used as a mask to obtain the morphology progression of a single tip which was examined after 6, 9 and 12 hours sputtering time. The diamond particle was still clearly visible on the tip after 6 and 9 hours. The final length of the tip is approximately 28 $\mu$m with a radius of curvature of approximately 40 nm. Elongation in one dimension and grooving due to initial particle shape were observed.

To ensure that a layered structure could be placed in the proper position for field evaporation, chromium was deposited onto a silicon wafer to a depth of 1.5 $\mu$m and sputtered using 3 $\mu$m particles to produce cone shaped structures with a layered region in near apex area.

304 stainless steel was also used to produce tips using 3 m particles. Tips were also fabricated from the high temperature superconductor material BiSrCaCuO (2212 phase). Tips were formed with their axis along the c direction by depositing 3 m particles onto single crystals with a [001] surface normal. This structure will enable subsequent precise stoichiometric analysis and interplanar spacing measurements to be obtained.

It is desirable to utilize a regular array of high aspect ratio tips on substrates to facilitate operation of the atom probe. Such arrays allow easy access to the individual tips. Such tips can be fabricated by ion milling the substrate with small regions masked off. Photolithography and a lift-off evaporation can be used to define small dots (2–4 $\mu$m in diameter and 0.5 $\mu$m thick) of different metals, such as nickel or tungsten, in a regular array with the dots spaced 50 m apart. These deposited dots then serve as the mask for the etching of the tips by ion beam milling. Such a process is generally suitable for fabricating tips on most samples regardless of the specific chemistry of the sample. Samples to be examined will generally need to be highly polished and extremely flat to allow use of photolithography techniques in the defining of the dots since good contact between the optical mask and the substrate is essential for contact printing of features with these dimensions.

Figure 8:
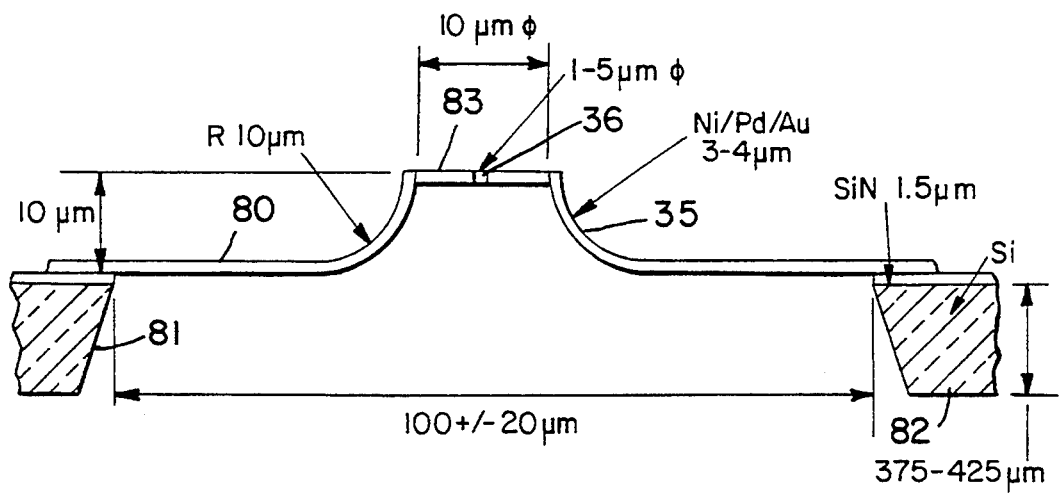
FIG. 8 is a cross-sectional view of the central portion of the local-extraction electrode of FIG. 7.
Figure 7:
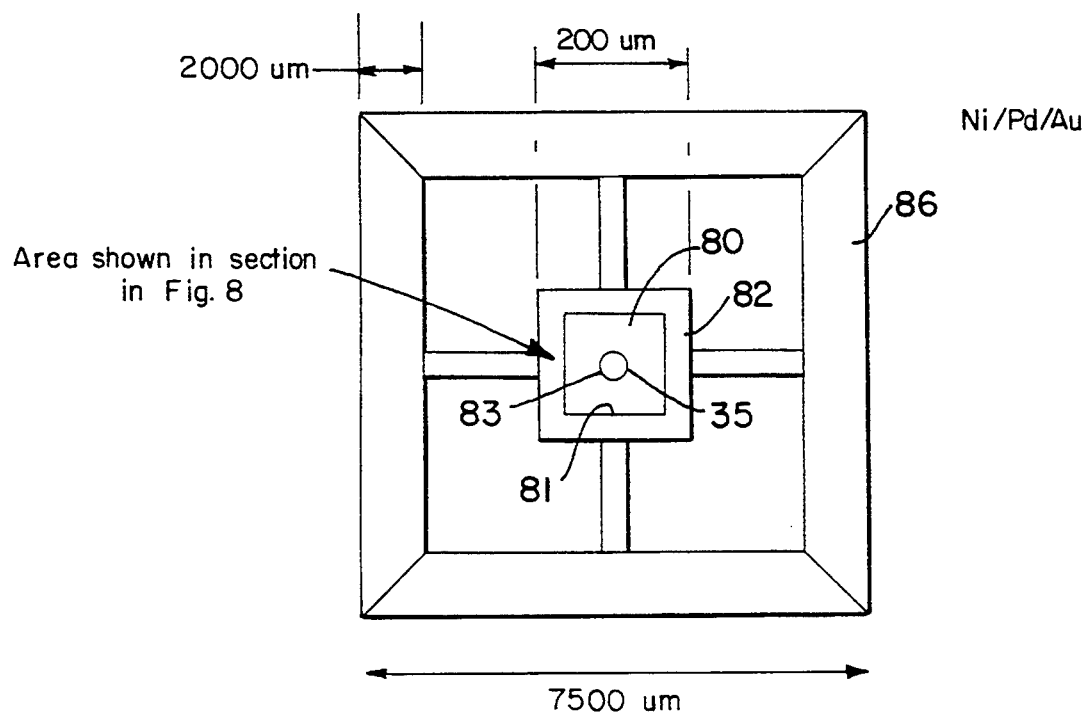
FIG. 7 is a top plan-view of a local-extraction electrode for use in the atom probe of the present invention.
Figure 9:
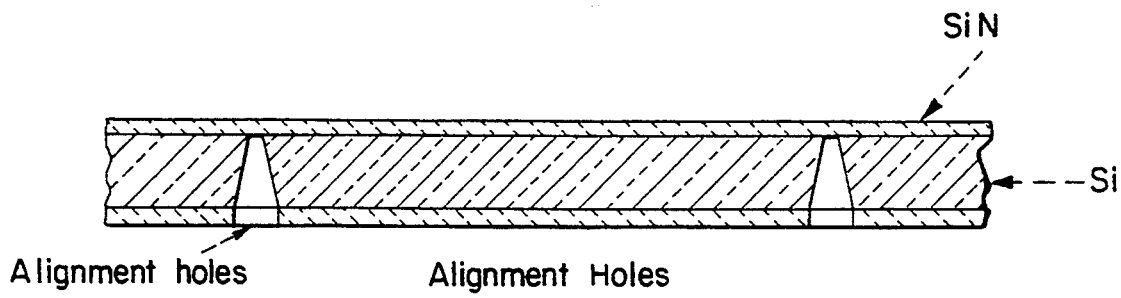
FIG. 9-12 are cross-sectional views showing the sequence of steps in the processing to produce the local-extraction electrode of FIG. 8.
Figure 10:
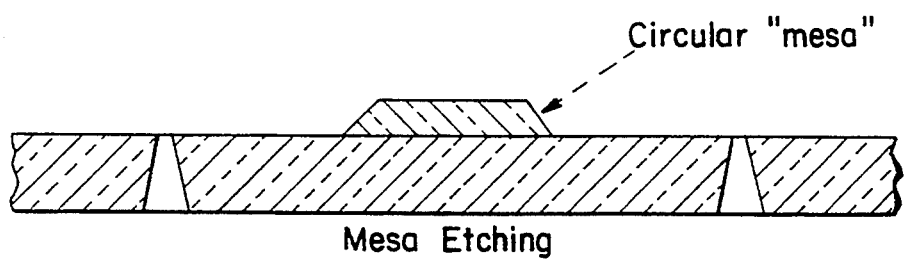
Figure 11:
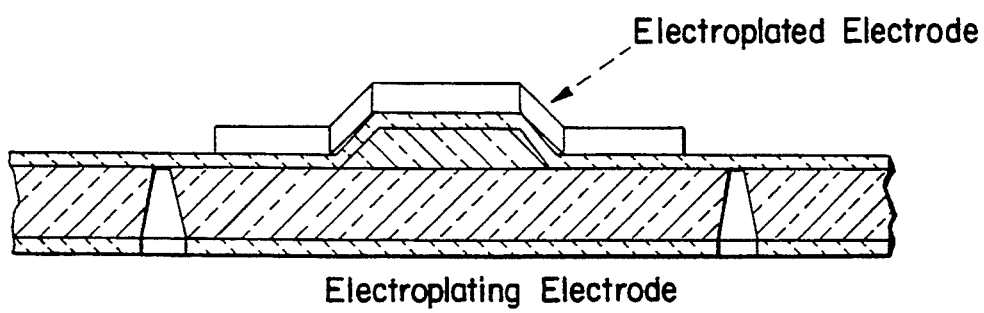
Figure 12:
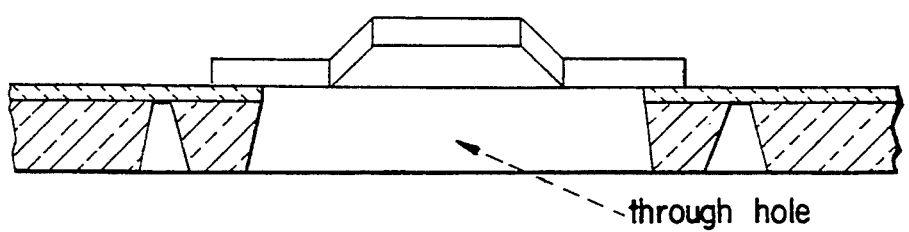

An exemplary structure for the local-extraction electrode is shown in FIGS. 7 and 8. The electrode is a thin membrane 80 stretched over a through-hole 81 in a silicon wafer 82. The center portion of the membrane in these electrodes is shaped to a projecting "volcano" or "mesa" 35 in which an opening 36, e.g., 1–5 $\mu$m in diameter, is provided in a flat top 83 of the mesa for the purpose of allowing evaporated atoms to pass through. As shown in FIG. 8, the flat top 83 may be about 10 $\mu$m in diameter. The "volcano" may be 10–15 μm high and the membrane 80 about 100 μm on a side and square. The membrane may consist of 3–4 μm electroplated metal such as nickel or molybdenum. Deflection of such an electrode is estimated to be well under 0.1 μm in operation, eliminating possible shorting to the sample. Exemplary overall dimensions of the electrode are 7500 μm × 7500 μm to facilitate easy mounting in a positioner. A 2000 m wide metal boundary 86 (connected with the central electrode) can be used to provide for easy connection to the high voltage pulsing circuitry.

A combination of surface and bulk silicon micromachining processes may be used in the fabrication of these electrodes. The main stages of the electrode fabrication process are shown in FIGS. 9–12. A substrate which may be used is a 3 inch silicon wafer of <100> orientation. The main process steps are as follows:

A. Fabricating through holes in silicon wafers for alignment purposes (FIG. 9):
  1. Deposition of oxide/nitride (0.25 μm/2.5 μm) on silicon wafers
  2. Photolithography of back side of wafers [Mask level 1]
  3. Plasma etching to transfer pattern to nitride
  4. KOH etch of through hole in silicon wafer
  5. Strip Nitride
B. Fabrication of circular mesas (FIG. 10):
  6. Photolithography on wafer top side [Mask level 2]
  7. Plasma etching of 10 μm high circular mesas/volcanoes in silicon
  8. Deposition of oxide/nitride
C. Fabrication of metal electrodes (FIG. 11):
  9. Evaporate plating base of Cr/Au
  10. Lithography to define electrodes [Mask level 3]
  11. Electroplating metal electrode (Ni, Pd)
  12. Removal of plating base by ion beam milling/wet etching
D. Fabrication of through holes (FIG. 12):
  13. Photolithography on back side of wafers [Mask level 4]
  14. Plasma etching for pattern transfer to nitride
  15. KOH etching of through holes with wafer face protected
  16. Plasma etching to remove nitride Minor steps such as wafer cleaning or descums are not indicated above. An extra mask level and additional process steps may be included after step 7 or step 11 to include ribs to stiffen the structure, if desired.

It is essential that the electrode be rigid enough and its deflection on the application of the high voltage pulse be sufficiently small so that the electrode does not short to the sample. Given the shape of the electrode, the load on the membrane will consist of a uniformly distributed load and a concentrated load at the center. For purposes of estimating the deflection it is assumed that the latter is uniformly distributed over the entire membrane as well. Moreover, the stiffening effect of the projection as well as the effect of the hole in the center are neglected. The loads acting on the membrane can be estimated using the relation:

$$F = dE/dx \rightarrow F/A = \epsilon_o V^2 / 2x^2$$

where F is the force, A is the area on which the force is acting, E is the energy stored in the capacitance, x is the separation between the electrodes, V is the applied voltage and $\epsilon_o$ is the electrical permitivity of free space.

If the electrode is positioned 1 μm away from the substrate, the load at the center of the membrane is estimated to be about $4.4 \times 10^4$ N m$^{-2}$ and the load over the entire membrane $4.4 \times 10^4$ N m$^{-2}$. Considering the relative areas, this corresponds to a uniform loading of about $8.8 \times 10^4$ N m$^{-2}$ over the entire membrane.

The deflection at the center of a square membrane can be estimated from the relation:

$$d = 0.0138(F/A)a^4/Eh^3$$

where d is the deflection, a is the length of the square, h is the thickness of the membrane and E is the elastic modulus of the material. Assuming the membrane to be 100 μm wide and the material to be electroplated nickel with a thickness of 4 μm and an elastic modulus of about 200 GPa, the deflection on application of 1,000 V between the electrode and the sample will be about 10 nm.

It is preferable that the selection of tips on the sample and rough alignment of the local-extraction electrode to the tips be accomplished using an optical microscope instead of a scanning electron microscope. Since the required diameter of the aperture is about 1–5 μm, this will not be possible using metallic electrodes. Typical optically transparent conducting thin films, such as indium tin oxide (InSnO), have adequate transmission only up to thicknesses of about 200 nm. This thickness generally would not enable the fabrication of an electrode with adequate mechanical rigidity to withstand significant deflection on application of high voltage pulses.

Figure 13:
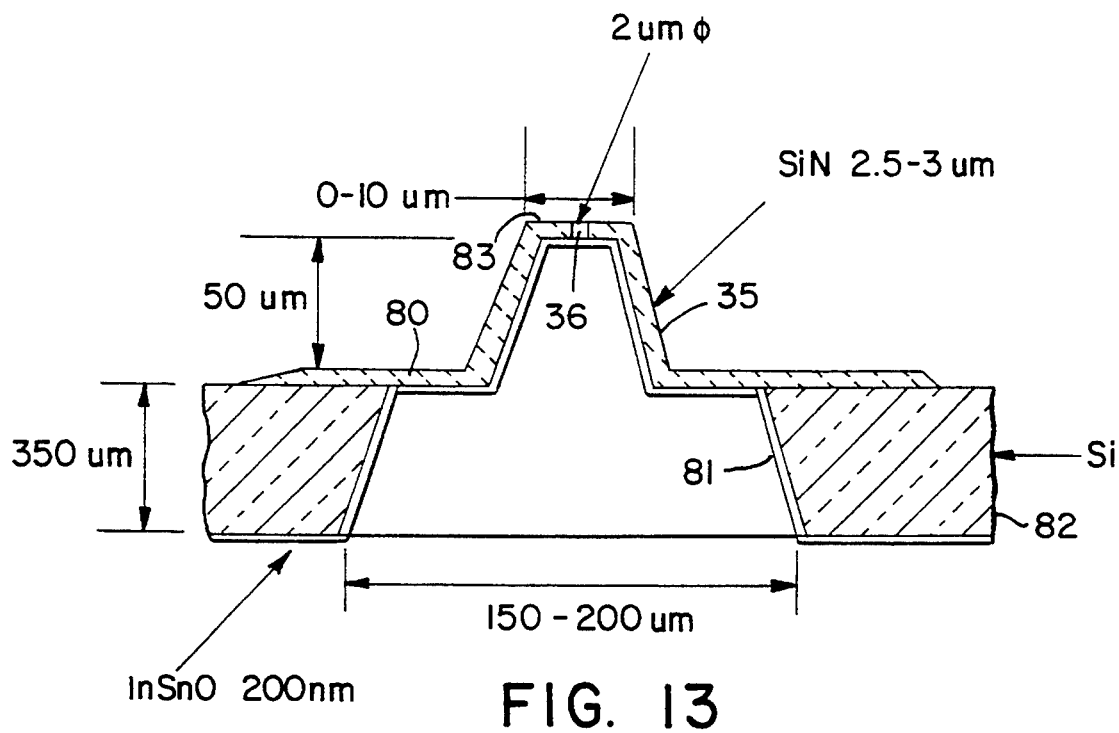
FIG. 13 is a cross-sectional view of another structure for a local-extraction electrode which is optically transparent.

To obtain both optical transparency and adequate mechanical strength, a bilayered structure may be used for the electrode as shown in FIG. 13. An amorphous silicon nitride film about 2.5–3 μm thick is used to provide the mechanical strength and is backed up by a conductive film, e.g., InSnO. Amorphous silicon nitride (SIN) films produced by low pressure chemical vapor deposition (LPCVD) of this thickness have adequate mechanical strength and optical transmission (with proper choice of deposition conditions) for this purpose.

Silicon micromachining techniques may be used to fabricate electrodes of this type with the required "conical" shape which will enable easy access of the electrode to the tips. A summary of the fabrication process is given below:
  1. Patterning and etching of through holes in silicon wafers using anisotropic/isotropic etching for subsequent double sided alignment (necessary if a double sided mask aligner is not available).
  2. Fabrication of "cones", "pyramids" or "mesa" structures using isotropic/anisotropic wet/plasma etching of silicon.
  3. Deposition of LPCVD SiN.
  4. Fabrication of apertures in the silicon nitride by photolithography/plasma etching or "plasma etchback" techniques.
  5. Patterning and etching through holes in the silicon wafer aligned to the conical structures.
  6. Deposition of InSnO by sputtering or other techniques.

Another alternative for preparation of a local-extraction electrode employs mechanical cutting and polishing of a sharp conical tip on, e.g., an aluminum rod to produce a preform. This tip is coated with a different material which is chosen so that the preform can be dissolved without affecting it. For example, the preform can be electroplated with nickel and the aluminum preform dissolved with concentrated KOH. The thickness of this coating can be varied if necessary to provide adequate rigidity to the final structure. A hole is produced at the apex by mechanical or electrochemical polishing, or cutting with a laser or ion beam. The preform is then dissolved leaving the electrode which is shaped as a hollow conical shell with an aperture at the apex. Specifically, aluminum rods can be turned to produce conical structures having a radius of curvature at the apex of the cones typically about 10 μm or less. The angle of the cone can be varied but is typically 40°, with a height about 3 mm. A gold (10–35 nm thick) plating base is evaporated or sputtered on the aluminum mandrels and 2.5 μm nickel is electroplated on the plating base. To provide the final structure with greater rigidity, the tip can be masked off and more nickel (20 μm) plated over the rest of the mandrel. The aluminum is etched away in 20% (wt.)KOH at about 70° C., leaving a hollow conical nickel shell. Electrode apertures are then made at the tops of the nickel shells by focused ion beam etching of the nickel. Apertures 1–2 μm in diameter can be made in 2.5 m nickel using this technique. Focused laser ablation may also be employed for this purpose. Another alternative is to grind back the cone tip before etching the mandrel and subsequently electroplating again to finish the hole to the desired diameter.

The mass resolution of time-of-flight atom probe can be written as a quadratic sum of at least four terms:

$$\left[\frac{\Delta m}{m}\right]^2 =$$

$$\left[\frac{\Delta V}{V_{TOT}}\right]^2 + \left[\frac{\Delta t_p}{t}\right]^2 + \left[\frac{\Delta t_e}{t}\right]^2 + \left[\frac{\Delta R}{R}\right]^2$$

where m is the mass of an ion, ΔV is the variation in the total voltage that the ion is accelerated through, $V_{tot}$ is the total applied voltage between tip and detector, t is the time of flight, $\Delta t_p$ is the time duration of the evaporation pulse, $\Delta t_c$ is the time resolution of the timing electronics, and R is the flight distance from the tip to the detector. For the purposes of the calculations below, the timing terms can be grouped together as:

$$\Delta t^2 = \Delta t_p^2 + \Delta t_c^2$$

In general, variations in R are not significant in atom probe work either because they are small relative to other effects (conventional atom probe), they can be accounted for in the analysis of the three-dimensional atom probe (3DAP), or R does not vary across the image (wide angle atom probe with curved microchannel plates). Thus in general, variations in R will not affect the mass resolution and the last term in the time-of-flight mass resolution equation may be dropped. The time-of-flight in an atom probe is usually determined to first order by setting the potential energy decrease of an ion to its gain in kinetic energy and solving for t as:

$$t^2 = \frac{1}{2e} \frac{m}{n} \frac{R^2}{V_{TOT}}$$

where the final ion speed is taken to be R/t. Substituting into the mass resolution equation for t yields:

$$\frac{m}{\Delta m} = \left[\left(\Delta \frac{V}{V_{TOT}}\right)^2 + \left(\frac{\Delta t \sqrt{V_{TOT}}}{\sqrt{\frac{1}{2e} \frac{m}{n}} R}\right)^2\right]^{-\frac{1}{2}}$$

For conventional atom probes, there has been only one applied potential to account for $V_{tot}$. The energy spread of evaporated ions that results from a voltage pulse is about 3% of $V_{tot}$. Note that the mass resolution is usually cited for the full width at half maximum of a peak in a mass spectrum. This energy spread is about one sixth of the maximum. Thus, for a conventional atom probe, the voltage spread is:

$$\Delta V = \frac{0.03}{6} V_{TOT}$$

In a LEAP, the extraction voltage $V_{ex}$ can be pulsed independent of the total voltage, $V_{tot}$. The same relationship should hold for pulsing $V_{ex}$ and, thus, for an LEAP, the predicted voltage spread is $$\Delta V = \frac{0.03}{6} V_{EX}$$

It is well known that conventional atom probes, in general, are limited in resolution by the "energy deficit" that results from voltage pulsing. It can be shown that at large R and small $V_{tot}$, the mass resolution is greatest because that is where the flight times are greatest and the timing resolution term in the mass resolution equation is insignificant. The maximum achievable mass resolution in a conventional atom probe with a 1 m flight path is limited by the energy deficit to a value of $(V_{tot}/\sqrt{}\Delta V) = (6/0.03) = 200$. The only way to increase the mass resolution is to extend the flight length R. Note also that the practical maximum $V_{tot}$ has been about 40 kV, which is dictated by the radius of curvature of the tip. Even so, the mass resolution decreases with increasing $V_{tot}$.

The same performance calculations may be performed for a local electrode atom probe (LEAP) for several instrument operating criteria. In particular, the effect of timer resolution and extraction voltage magnitude may be considered. Both 1 ns and 156 ps timing resolution are examined because they are both available commercially. Extraction voltages of 300 volts or less may be utilized as appropriate, but to include a conservative estimate, calculations are performed for $V_{ex} = 1,000$ volts also. FIGS. 14–17 show the 4 permutations on these 2 parameters.

A new feature of the LEAP calculations is the appearance of contours nearly parallel to the R axis and a ridge of maximum resolution. These are the result of a fixed ΔV which is introduced in LEAP. If maximum mass resolution is desired, then the ridge corresponds to the optimum combination of R and $V_{tot}$ for a given mass resolution. The presence of contours parallel to the R axis shows that the energy deficit term dominates the mass resolution, i.e., changes in R have no effect. Conversely, the contours parallel to the $V_{tot}$ axis correspond to the timing resolution dominating the mass resolution. In this region, improvements in timing resolution lead directly to improved mass resolution. There are thus two faces on this mass resolution surface on either side of the ridge; one which is energy deficit limited and one which is timing resolution limited. Improvements in either the energy deficit or the timing resolution make the respective faces steeper and the ridge height greater. The present invention makes possible improvements on both fronts as described below.

Figure 14:
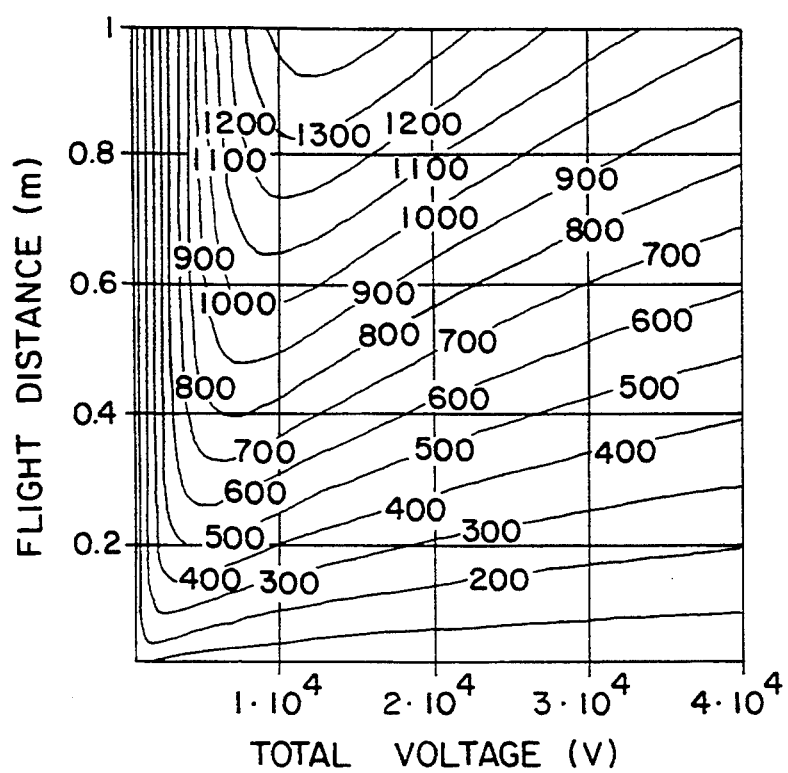
FIGS. 14-17 are graphs showing the lines of constant mass spectral resolution as related to length of flight (from the tip to the detector) and the total applied voltage between the tip and the detector, with the extraction voltage and the timer uncertainty having the following values.

FIG. 14 uses the most conservative values of the operation criteria for a LEAP and shows that high mass resolution obtainable. Since a mass resolution of about 600 is where some difficult isotope separations in middle atomic number materials become possible, it is of interest to focus on that number. This value is expected in the range of R=300 mm and $V_{tot}$=3 to 10 kV.

Figure 16:
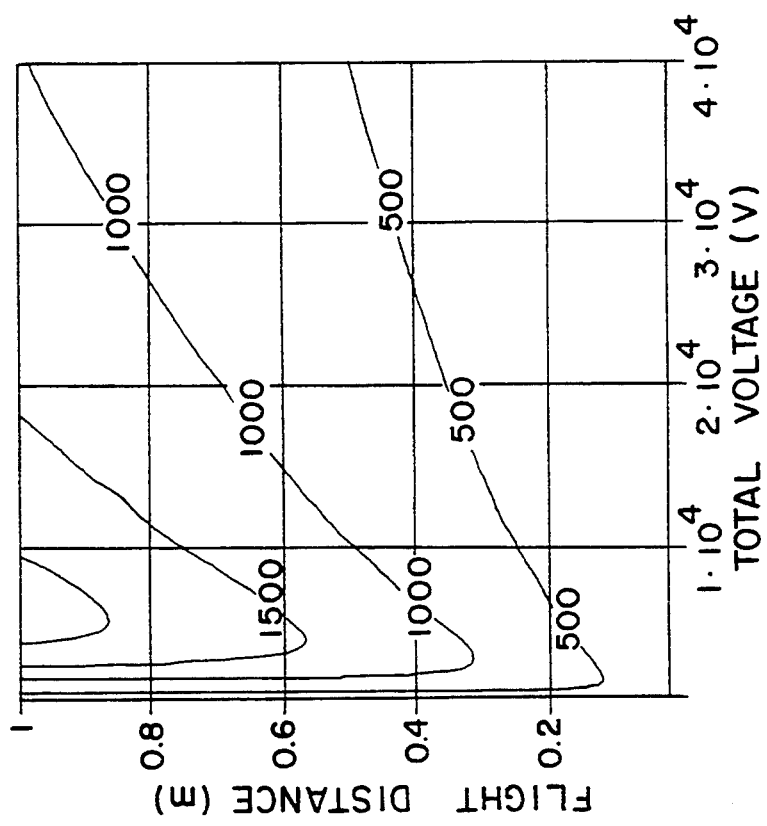
Figure 15:
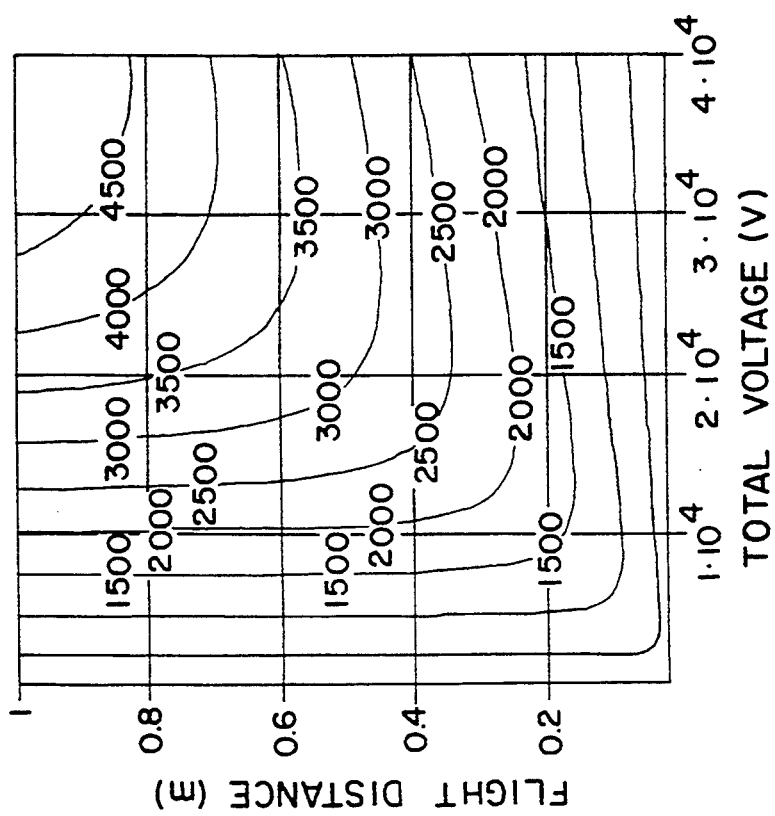
Figure 17:
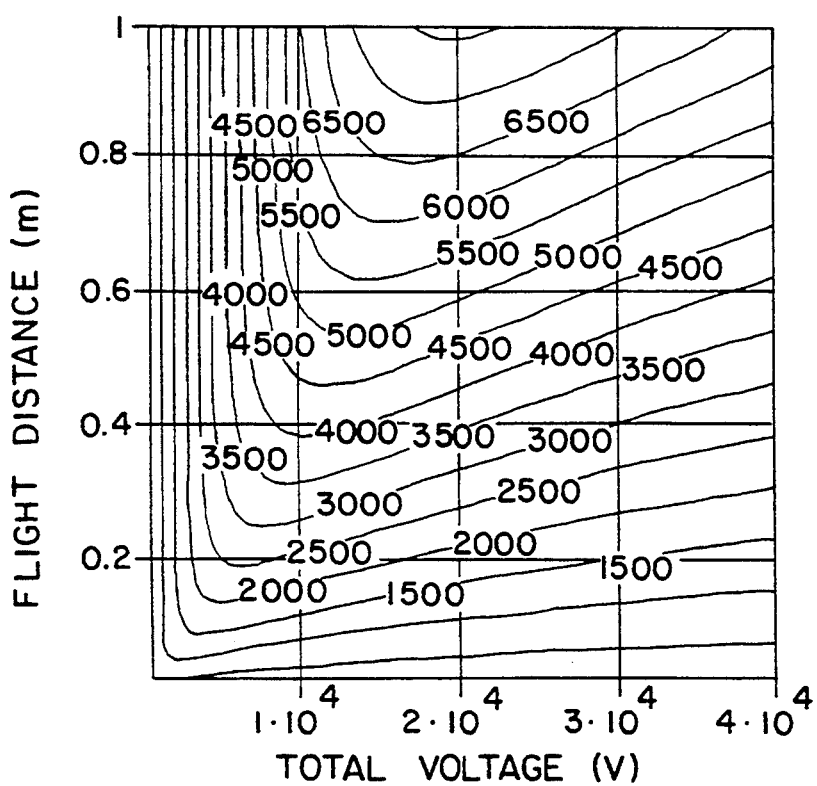

FIG. 15 shows the effect of improving the timing resolution in a LEAP. Compared to FIG. 14 the maximum mass resolution increases by about a factor of 3 and the ridge moves upward and over to greater values of R and $V_{tot}$. Better timing resolution for LEAP leads to better mass resolution everywhere except on the energy-deficit-limited face of the surface. FIG. 16 shows the effect of a reduction of $V_{ex}$. The maximum resolution increases by about a factor of 1.5 and the slope of the energy-deficit-limited face increases. The ridge thus moves to lower values of $V_{tot}$. FIG. 17 shows the effect of both improved timing resolution and less $V_{ex}$, and exhibits values of achievable mass resolution which are generally about a factor of 5 better than that shown in FIG. 14.

In a conventional atom probe the magnification of the image depends on the radius of curvature of the tip relative to the distance between the tip and the detector. For a given specimen the magnification cannot be changed except by changing the tip-detector distance. This affects other operating parameters like time-of-flight and solid angle subtended by the detector. Because of the difficulty in moving the detector or the tip on a regular basis, the flight distance is usually fixed and the magnification changes only with specimen geometry, e.g., as the tip gets blunter by field evaporation during an experiment, the image magnification changes accordingly. The atom probe of the present invention employing an extraction electrode can overcome these limitations.

At a minimum, the shape of the extraction electrode can affect the image magnification independent of the specimen geometry. This is illustrated by considering the following two extremes. If the extraction electrode is essentially a flat plate that is the same diameter as the detector with a small aperture for the ions to pass through, then there would be almost no magnification change but rather, good collimation of the field ionized species would be achieved. The field lines between the extraction electrode and the detector would be essentially as in a parallel plate geometry. The other extreme is the situation where the extraction electrode is a very small plate with a small aperture for the ions to pass through. This creates divergent field lines, and high magnification is achieved. Different extraction electrodes could be used to accomplish different optical results and these could be exchangeable on a given instrument.

Alternatively, the potential on an accelerating electrode may be used to control the divergence of the paths of the evaporated ions. If the acceleration electrode is negative with respect to the extraction electrode, then the beam would be expanded, whereas if it is positive with respect to the extraction electrode, it would suppress divergence and tend to compress the beam. This electrostatic approach has the advantage of ease of control relative to physically changing the extraction electrode. However, such a system would have differing effects on ions of different mass-to-charge ratio. These different trajectories may be accounted for in the analysis, especially in 3DAP.

It is understood that the invention is not confined to the particular embodiments set forth herein as illustrative, but embraces such modified forms thereof as come within the scope of the following claims.

What is claimed is:

1. Atom probe apparatus comprising:
   (a) a tip adapted to have atoms evaporated from the surface of the tip;
   (b) a local-extraction electrode positioned closely adjacent to the tip, the extraction electrode having an aperture therein positioned adjacent to the tip to allow ions evaporated from the tip to pass through the aperture;
   (c) a detector mounted to receive charge from ion evaporation events at the tip and provide a signal indicative of the time of incidence of a charge cloud thereon resulting from an ion evaporation event at the tip; and
   (d) power supply means for applying voltages to the tip, to the extraction electrode and to the detector, the power supply means maintaining the extraction electrode at a potential intermediate that of the potential between the tip and the detector so that the potential difference between the tip and the extraction electrode is low relative to the potential between the tip and the detector, and for pulsing the potential difference between the tip and the extraction electrode sufficiently to extract ions from the tip by field evaporation which pass through the aperture in the extraction electrode and are accelerated to the detector by the potential difference between the extraction electrode and the detector.

2. The apparatus of claim 1 wherein the detector also provides a signal indicative of the position of incidence of the charge cloud.

3. The apparatus of claim 1 wherein the tip is formed on a flat substrate having a plurality of tips formed thereon which extend from the surface of the substrate, and wherein the extraction electrode is positioned so that its aperture is aligned with and closely adjacent to a selected one of the tips on the substrate.

4. The apparatus of claim 1 including an intermediate acceleration electrode having an aperture therein, the intermediate acceleration electrode positioned between the extraction electrode and the detector with the aperture therein positioned to pass ions which have passed through the aperture in the extraction electrode therethrough to the detector, and wherein the power supply means provides a potential to the intermediate acceleration electrode.

5. The apparatus of claim 4 wherein the power supply means provides a potential to the intermediate acceleration electrode which is the same as the potential applied to the detector.

6. The apparatus of claim 1 wherein the power supply means provides a bias potential between the extraction electrode and the tip of approximately 1,000 volts or less and provides a pulse potential between the extraction 7. The apparatus of claim 1 wherein the power supply means provides pulses of potential between the extraction electrode and the tip which have a rise time of about 1 nanosecond or less and a duration time of about 5 nanoseconds or less.

8. The apparatus of claim 1 wherein the power supply means provides pulses of potential between the tip and the extraction electrode at a pulse repetition frequency greater than 1000 Hz.

9. The apparatus of claim 1 including means for measuring the time of flight of ions from the tip to the detector.

10. The apparatus of claim 1 wherein the extraction electrode is formed of a planar structure having a raised central mesa portion, a flat top on the mesa, and an aperture in the flat top, wherein the flat top of the extraction electrode mesa has a diameter on the order of 10 μm and the aperture therein has a diameter in the range of 1 to 5 μm.

11. The apparatus of claim 1 including means for positioning the tip relative to the extraction electrode and means for measuring the field emission current as the tip is moved relative to the extraction electrode thereby to allow the extraction electrode to be properly aligned with the tip.

12. The apparatus of claim 1 wherein the extraction electrode is substantially optically transparent.

13. The apparatus of claim 12 wherein the extraction electrode is formed of a layer of silicon nitride with a layer of optically transparent conductive film formed thereon.

14. The apparatus of claim 13 wherein the conductive film is formed of indium tin oxide.

15. Atom probe apparatus comprising:
(a) a tip adapted to have atoms evaporated from the surface of the tip;
(b) a local-extraction electrode positioned closely adjacent to the tip, the extraction electrode having an aperture therein positioned adjacent to the tip to allow ions evaporated from the tip to pass through the aperture;
(c) a detector mounted to receive charge from ion evaporation events at the emission tip and provide a signal indicative of the time of incidence of a charge cloud thereon resulting from an ion evaporation event at the tip;
(d) an intermediate acceleration electrode having an aperture therein, the intermediate acceleration electrode positioned between the extraction electrode and the detector with the aperture therein positioned to pass ions which have passed through the aperture in the extraction electrode therethrough to the detector; and
(e) power supply means for applying voltages to the tip, to the extraction electrode, to the intermediate acceleration electrode, and to the detector, the power supply means maintaining the extraction electrode at a potential intermediate that of the potential between the tip and the detector so that the potential difference between the tip and the extraction electrode is low relative to the potential between the tip and the detector, for providing a potential between the intermediate acceleration electrode and the tip, and for pulsing the potential difference between the tip and the extraction electrode sufficiently to extract ions from the tip by field evaporation which pass through the aperture in the extraction electrode and through the aperture in the intermediate acceleration electrode and are accelerated to the detector by the potential difference between the extraction electrode and the intermediate acceleration electrode and the detector.

16. The apparatus of claim 15 wherein the detector also provides a signal indicative of the position of incidence of the charge cloud.

17. The apparatus of claim 15 wherein the tip is formed on a flat substrate having a plurality of tips formed thereon which extend from the surface of the substrate, and wherein the extraction electrode is positioned so that its aperture is aligned with and closely adjacent to a selected one of the tips on the substrate.

18. The apparatus of claim 15 wherein the power supply means provides a potential to the intermediate acceleration electrode which is the same as the potential applied to the detector.

19. The apparatus of claim 15 wherein the power supply means provides a bias potential between the extraction electrode and the tip of approximately 1,000 volts or less and provides a pulse potential between the extraction electrode and the tip which is an additional voltage above the bias potential at a level sufficient to extract ions by field evaporation from the tip.

20. The apparatus of claim 15 wherein the power supply means provides pulses of potential between the extraction electrode and the tip which have a rise time of about 1 nanosecond or less and a duration time of about 5 nanoseconds or less.

21. The apparatus of claim 15 wherein the power supply means provides pulses of potential between the tip and the extraction electrode at a pulse repetition frequency greater than 1000 Hz.

22. The apparatus of claim 15 including means for measuring the time of flight of ions from the tip to the detector.

23. The apparatus of claim 15 wherein the extraction electrode is formed of a planar structure having a raised central mesa portion, a flat top on the mesa, and an aperture in the flat top, wherein the flat top of the extraction electrode mesa has a diameter on the order of 10 μm and the aperture therein has a diameter in the range of 1 to 5 μm.

24. Atom probe apparatus comprising:
(a) a tip adapted to have atoms evaporated from the surface of the tip;
(b) a detector mounted to receive charge from ion evaporation events at the emission tip and provide a signal indicative of the time of incidence of a charge cloud thereon resulting from an ion evaporation event at the tip;
(c) an intermediate acceleration electrode having an aperture therein, the intermediate acceleration electrode positioned between the tip and the detector with the aperture therein positioned to pass ions evaporated from the tip therethrough to the detector; and
(d) power supply means for applying voltages to the tip, to the intermediate acceleration electrode and to the detector, the power supply means maintaining the intermediate acceleration electrode at a potential intermediate that of the potential between the tip and the detector, and for pulsing the potential difference between the tip and the intermediate acceleration electrode sufficiently to extract ions from the tip by field evaporation which pass through the aperture in the intermediate acceleration electrode and are accelerated to the detector by the potential difference between the intermediate acceleration electrode and the detector.

25. The apparatus of claim 24 wherein the detector also provides a signal indicative of the position of incidence of the charge cloud.

26. The apparatus of claim 24 including means for measuring the time of flight of ions from the tip to the detector.

27. A method for evaporating ions from a tip in an atom probe comprising the steps of:
  (a) providing an extraction electrode having an aperture therein closely adjacent to a tip so that ions emitted from the tip pass through the aperture in the extraction electrode;
  (b) applying a potential difference between the tip and the extraction electrode which is below but near the potential required to extract ions from the tip by field evaporation, and applying a larger potential between the tip and a detector spaced at a distance from the extraction electrode, the detector positioned to receive ions passed through the aperture of the extraction electrode; and
  (c) applying an additional pulse of potential difference between the tip and the extraction electrode sufficient to cause field evaporation of ions from the tip which pass through the aperture in the extraction electrode and are accelerated to the detector by the larger potential difference between the tip and the detector.

28. The method of claim 27 including the additional steps of providing an intermediate acceleration electrode between the extraction electrode and the detector, the acceleration electrode having an aperture therein positioned to receive ions passed from the tip through the aperture in the extraction electrode and passing such ions through the aperture in the acceleration electrode to the detector, and
  applying a constant potential difference between the emission tip and the intermediate acceleration electrode.

29. The method of claim 28 wherein the potential difference between the tip and the intermediate acceleration electrode is the same as the potential difference between the tip and the detector.

30. The method of claim 27 wherein the step of applying a pulse of potential difference between the tip and the extraction electrode is repeated at a pulse repetition rate of greater than 1000 Hz.

31. The method of claim 27 wherein the rise time of each pulse of potential is about 1 nanosecond or less and has a duration of about 5 nanoseconds or less.

* * * * *

UNITED STATES PATENT AND TRADEMARK OFFICE
CERTIFICATE OF CORRECTION

PATENT NO. : 5,440,124
DATED : August 8, 1995
INVENTOR(S) : Thomas F. Kelly, et al.

It is certified that error appears in the above-indentified patent and that said Letters Patent is hereby corrected as shown below:

In column 3, line 6 of the patent, "106" should be --$10^6$--

In column 4, line 62 of the patent, "voltage°" should be --voltage.--

In column 6, line 32 of the patent, "100 volts" should be --1000 volts--

In column 10, line 35 of the patent, "3 m" should be --3$\mu$m--

In column 10, line 38 of the patent, "3 m" should be --3$\mu$m--

In column 10, line 50 of the patent, "50 m" should be --50$\mu$m--

In column 12, line 36 of the patent, "(SIN)" should be --(SiN)--

In column 13, line 22 of the patent, "2.5 m" should be --2.5 $\mu$m--

UNITED STATES PATENT AND TRADEMARK OFFICE
CERTIFICATE OF CORRECTION

PATENT NO. : 5,440,124
DATED : August 8, 1995
INVENTOR(S) : Thomas F. Kelly, et al.

It is certified that error appears in the above-indentified patent and that said Letters Patent is hereby corrected as shown below:

In column 13, line 43 of the patent, "$\Delta t_c$" should be --$\Delta t_c$-- line 25.

In column 13, line 48 of the patent, "$\Delta t_c^2$" should be --$\Delta t_c^2$--

In column 14, line 37 "$(V_{tot}/V\Delta V)$" should be --$(V_{tot}/\Delta V)$--

In column 16, line 66 of the patent, --electrode and the tip which is an additional voltage above the bias potential and at a level sufficient to extract ions by field evaporation from the tip.-- should be inserted after "extraction"

Signed and Sealed this

Thirtieth Day of July, 1996

Attest:

BRUCE LEHMAN

*Attesting Officer*   *Commissioner of Patents and Trademarks*